United States Patent
Seo et al.

(10) Patent No.: US 9,224,455 B1
(45) Date of Patent: Dec. 29, 2015

(54) METHOD AND APPARATUS FOR BIT-LINE SENSING GATES ON AN SRAM CELL

(71) Applicant: GLOBALFOUNDRIES Inc., Grand Cayman (KY)

(72) Inventors: Seunghwan Seo, Dresden (DE); Jongsin Yun, Austin, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/305,630

(22) Filed: Jun. 16, 2014

(51) Int. Cl.
*G11C 11/40* (2006.01)
*G11C 11/419* (2006.01)
*G11C 11/413* (2006.01)

(52) U.S. Cl.
CPC .............. *G11C 11/419* (2013.01); *G11C 11/40* (2013.01); *G11C 11/413* (2013.01)

(58) Field of Classification Search
CPC ..... G11C 11/40; G11C 11/413; G11C 11/419
USPC ...................... 365/154, 156, 63, 72
See application file for complete search history.

(56) References Cited

U.S. PATENT DOCUMENTS

| | | | | |
|---|---|---|---|---|
| 5,532,958 | A * | 7/1996 | Jiang et al. | 365/154 |
| 5,828,597 | A * | 10/1998 | Madan | 365/156 |
| 7,505,303 | B2 * | 3/2009 | Ashokkumar et al. | 365/154 |
| 7,535,751 | B2 * | 5/2009 | Huang et al. | 365/154 |
| 7,782,654 | B2 * | 8/2010 | Hayashi et al. | 365/154 |
| 7,898,894 | B2 * | 3/2011 | Chang et al. | 365/230.05 |
| 8,625,334 | B2 * | 1/2014 | Liaw | 365/154 |
| 8,710,592 | B2 * | 4/2014 | Lim et al. | 257/369 |

OTHER PUBLICATIONS

Chandra V. et al. "On the Efficacy of Write-Assist Techniques in Low Voltage Nanoscale SRAMs" EDAA, 2010, pp. 1-6.
Karl E et al. "A 4.6GHz 162Mb SRAM Design in 22nm Tri-Gate CMOS Technology with Intergrated Active Vmin-Enhancing Assit Circuitry" Session 131 ISSCC, IEEE, 2012, pp. 1-3.

* cited by examiner

*Primary Examiner* — Tan T Nguyen
(74) *Attorney, Agent, or Firm* — Ditthavong & Steiner, P.C.

(57) ABSTRACT

A circuit for providing additional current in a memory cell without a higher supply voltage is provided. Embodiments include a circuit having a six transistor static random access memory (SRAM) cell including a first inverter and second cross-coupled to a second inverter; a first transistor having a first source coupled to a first bit-line, a first drain coupled to the first inverter, and a first gate coupled to a word-line; a second transistor having a second source coupled to the second inverter, a second drain coupled to a second bit-line, and a second gate coupled to the word-line; and a plurality of bit-line sensing transistors coupled to the first transistor and to the second transistor.

15 Claims, 3 Drawing Sheets

FIG. 3

| OPERATION | WL | BL/BLX | 101/103 | 203/207 | 201/205 |
|---|---|---|---|---|---|
| Read | H | H/H | On | On | Off |
| Write | H | L/H | On | On | On/Off |
| Disturb (half selected cell) | H | H/H | On | On | Off |

301 — Read
303 — Write
305 — Disturb

300

US 9,224,455 B1

METHOD AND APPARATUS FOR BIT-LINE SENSING GATES ON AN SRAM CELL

TECHNICAL FIELD

The present disclosure relates to an interface circuitry of a memory cell. The present disclosure is particularly applicable to access gates of a static random access memory (SRAM) cell circuit.

BACKGROUND

Generally, an electronic circuit of a memory cell may be associated with various interface elements and signals that provide access to the memory cell. For example, a processor in a computer may utilize the interface circuitry to read data that is stored in an SRAM memory cell or to write/store data in the SRAM memory cell.

FIG. 1 schematically illustrates a traditional SRAM cell circuitry 100 utilized in an integrated circuit (IC) design. The SRAM memory cell includes interface circuitry for accessing the memory cell in order to read data stored therein or to write data in the memory cell. For example, the memory cell 100 includes a first access gate having a first transistor 101 and a second access gate having a second transistor 103 that provide access to memory cell inverter circuit 105, which can store data (e.g., zeroes and ones.) Additionally, one or more interface signals on word-line (WL) 107, a first bit-line (BL) 109, and a second BL (BLX) 111 may be utilized to access the memory cell inverter circuit 105, wherein various combinations of the interface signals can provide for various interactions/operations at the memory cell. For example, with the WL signal and pre-charged BL and BLX at a high voltage state (e.g., at logic 1), an operation of reading the memory cell content can be initiated. However, with technological advances in reduced IC node designs (e.g., scaling, smaller transistors) and lower supply voltages, the access gate transistors in a conventional SRAM design may be unable to function reliably or consistently. For instance, lower levels of supply voltage and current (i.e., ampere=I) at an SRAM cell can cause a failure of one or more functions/operations (e.g., read, write, retention, etc.) at the cell. A known approach to improve write ability is to include a write assist circuit. However write assist circuits take additional area on the chip.

A need therefore exists for methodology and circuitry enabling additional current for access gates in a memory cell without increasing supply voltage or sacrificing SRAM array area.

SUMMARY

An aspect of the present disclosure is a circuit to provide additional current for access gates in a memory cell without a higher supply voltage, assist circuits, or additional time consumption.

Another aspect of the present disclosure is a method for implementing a circuit to provide additional current for access gates in a memory cell without a higher supply voltage, assist circuits, or additional time consumption.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a circuit including: a six transistor SRAM cell that includes a first inverter cross-coupled to a second inverter, a first transistor having a first source coupled to a first bit-line, a first drain coupled to the first inverter, and a first gate coupled to a word-line, and a second transistor having a second source coupled to the second inverter, a second drain coupled to a second bit-line, and a second gate coupled to the word-line; and a plurality of bit-line sensing transistors coupled to the first transistor and to the second transistor. Some aspects further include a circuit where the first transistor and the second transistor include passgate n-type metal-oxide-semiconductor (NMOS) field-effect transistors (FETs).

Further aspects include the plurality of bit-line sensing transistors having a third transistor having a third source coupled to the first source, a third drain coupled to the first drain, and a third gate; a fourth transistor having a fourth drain coupled to the third gate, a fourth source coupled to the first bit-line, and a fourth gate coupled to the word-line; a fifth transistor having a fifth source coupled to the second source, a fifth drain coupled to the second drain, and a fifth gate; and a sixth transistor having a sixth source coupled to the second bit-line, a sixth drain coupled to the fifth gate, and a sixth gate coupled to the word-line. Other aspects include a circuit where each of the third transistor and the fifth transistor includes a write p-type metal-oxide-semiconductor (PMOS) transistor. Another aspect includes a circuit where each of the fourth transistor and the sixth transistor includes a write NMOS transistor. An additional aspect includes a circuit where the third transistor is in an active state when the first drain, the second bit-line, and the word-line are at a high voltage state, and the first bit-line is at a low voltage state.

Other aspects include the first inverter having a seventh transistor having a seventh source, a seventh drain, and a seventh gate, and an eighth transistor having an eighth source, an eighth drain, and an eighth gate; and the second inverter including a ninth transistor having a ninth source, a ninth drain, and a ninth gate, and a tenth transistor having a tenth source, a tenth drain, and a tenth gate, wherein the seventh source and the ninth source are coupled to a power rail, wherein the eighth source and the tenth source are coupled to a ground rail, wherein the seventh drain, the eighth drain, the ninth gate, and the tenth gate are coupled to the first drain, and wherein the ninth drain, the tenth drain, the seventh gate, and the eighth gate are coupled to the second source.

In another aspect the third transistor in the active state sources a higher current level during a write operation when compared to one or more other current levels sourced during one or more other operations at the SRAM cell.

An additional aspect of the present disclosure is a method including: providing a six transistor SRAM cell including providing a first inverter cross-coupled to a second inverter, providing a first transistor having a first source coupled to a first bit-line, a first drain coupled to the first inverter, and a first gate coupled to a word-line, and providing a second transistor having a second source coupled to the second inverter, a second drain coupled to a second bit-line, and a second gate coupled to the word-line; and providing a plurality of bit-line sensing transistors coupled to the first transistor and to the second transistor. In one aspect the first transistor and the second transistor include passgate NMOS transistors.

Another aspect of the present disclosure for providing the plurality of bit-line sensing transistors includes providing a third transistor having a third source coupled to the first source, a third drain coupled to the first drain, and a third gate; providing a fourth transistor having a fourth drain coupled to the third gate, a fourth source coupled to the first bit-line, and a fourth gate coupled to the word-line; providing a fifth transistor having a fifth source coupled to the second source, a fifth drain coupled to the second drain, and a fifth gate; and providing a sixth transistor having a sixth source coupled to the second bit-line, a sixth drain coupled to the fifth gate, and a sixth gate coupled to the word-line. In an additional aspect of the present disclosure each of the third transistor and the fifth transistor includes a write PMOS transistor. In one aspect of the present disclosure each of the fourth transistor and the sixth transistor includes a write NMOS transistor. In a further aspect of the present disclosure the third transistor is in an active state when the first drain, the second bit-line, and the word-line are at a high voltage state, and the first bit-line is at a low voltage state.

In some aspects of the present disclosure the method includes providing for the first inverter a seventh transistor having a seventh source, a seventh drain, and a seventh gate, and an eighth transistor having an eighth source, an eighth drain, and an eighth gate; providing for the second inverter a ninth transistor having a ninth source, a ninth drain, and a ninth gate, and a tenth transistor having a tenth source, a tenth drain, and a tenth gate; coupling the seventh source and the ninth source to a power rail; coupling the eighth source and the tenth source to a ground rail; coupling the seventh drain, the eighth drain, the ninth gate, and the tenth gate to the first drain; and coupling the ninth drain, the tenth drain, the seventh gate, and the eighth gate to the second source.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 3 illustrates a table of example combinations of access signals and related operations at an SRAM cell, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of low supply current available to access gates of an SRAM memory cell and/or additional area requirements for a write assist circuit attendant upon reducing bitcell size for an SRAM memory cell. The present disclosure addresses and solves such problems, for instance, by, inter alia, providing more current to the access gates by utilizing additional transistors that can provide the additional current once some of the control signals of the memory cell are activated.

Figure 1:
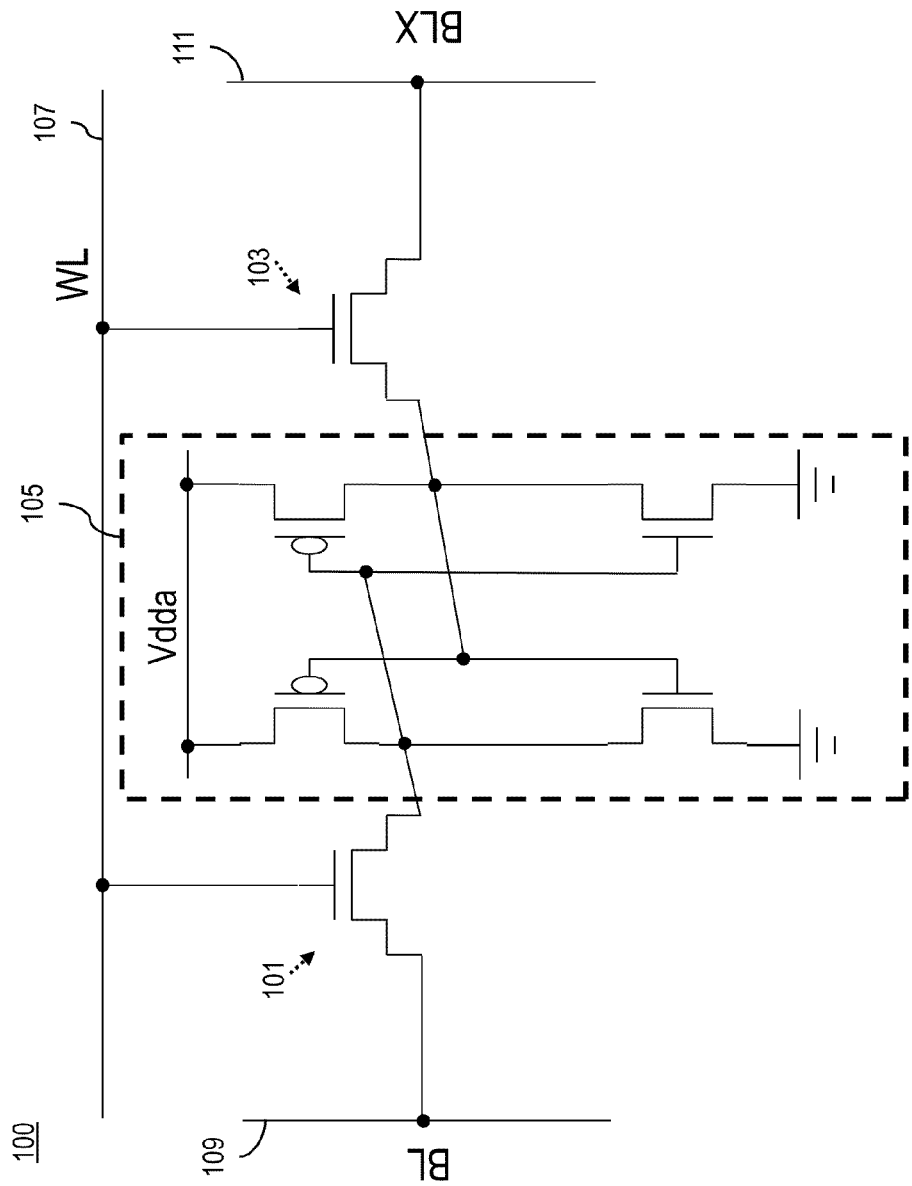
FIG. 1 schematically illustrates a traditional memory cell circuit utilized in an SRAM design.
Figure 2:
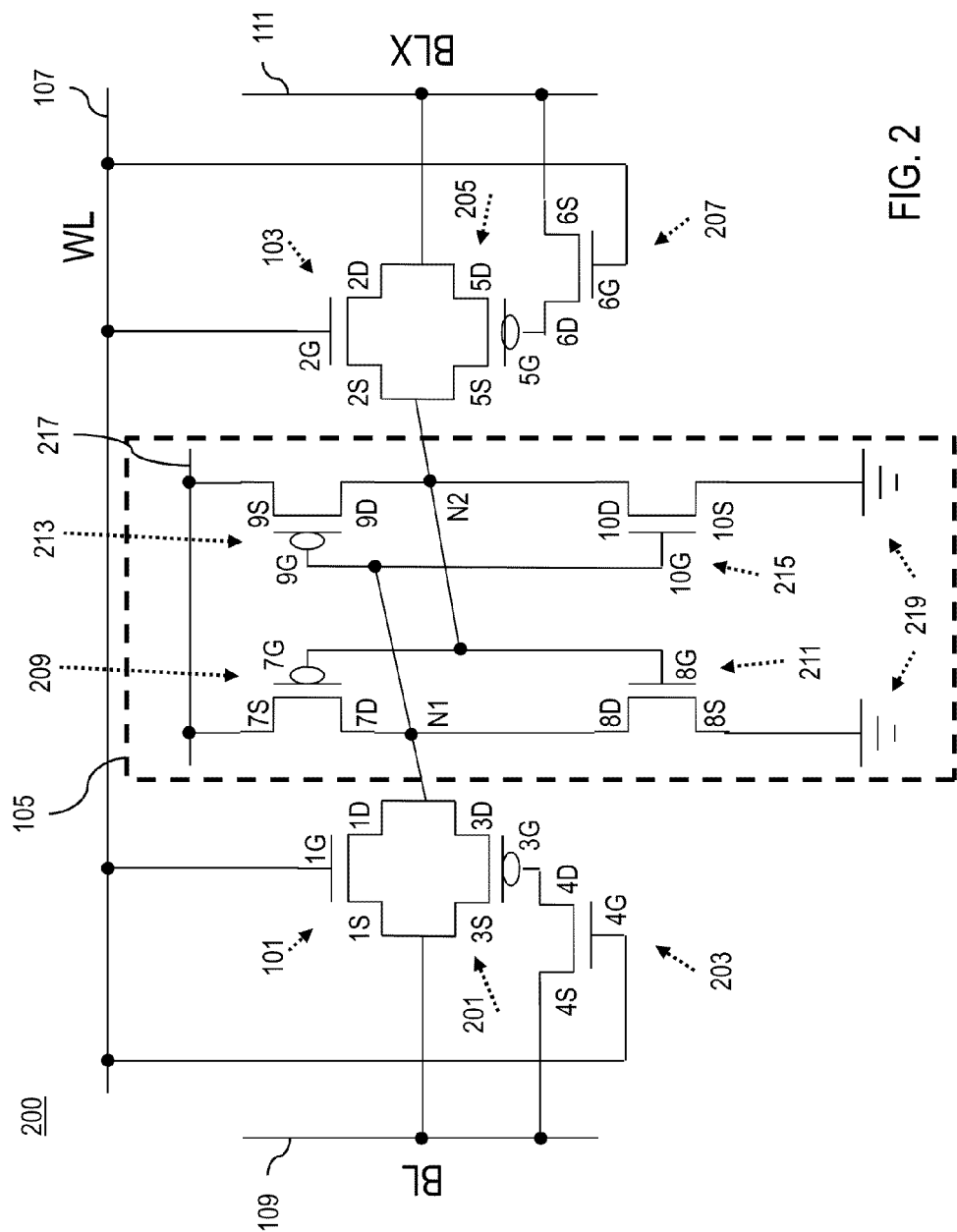
FIG. 2 schematically illustrates an SRAM cell design including circuitry to provide additional current to one or more access gates, in accordance with an exemplary embodiment.

FIG. 2 schematically illustrates an SRAM cell design including circuitry to provide additional current to one or more access gates, in accordance with an exemplary embodiment. FIG. 2 schematically illustrates circuit 200 including the first access gate having the first transistor 101, the second access gate having the second transistor 103, the memory cell inverter circuit 105, the WL 107, the BL 109, and the BLX 111, as in a traditional SRAM cell design. However, the first access gate additionally includes two supplemental transistors, a third transistor 201 and a fourth transistor 203, and the second access gate also includes two supplemental transistors, a fifth transistor 205 and a sixth transistor 207. The memory cell inverter circuit 105 includes two inverters, each with two transistors, as in the traditional SRAM cell. Specifically, the first inverter includes a seventh transistor 209 and an eight transistor 211, and the second inverter includes a ninth transistor 213 and a tenth transistor 215.

The first transistor 101 has a source 1S coupled to the BL 109, a drain 1D coupled to the first inverter, and a gate 1G coupled to the WL 107. The second transistor 103 has a source 2S coupled to the second inverter, a drain 2D coupled to the BLX 111, and a gate 2G coupled to the WL 107. The third transistor 201 has a source 3S and a drain 3D, coupled to the source 1S and drain 1D, respectively, of the first transistor, and a gate 3G. The fourth transistor 203 has a drain 4D coupled to the gate 3G, a source 4S coupled to the BL 109, and a gate 4G coupled to the WL 107. Similar to the third transistor 201, the fifth transistor 205 has a source 5S and a drain 5D, coupled to the source 2S and drain 2D, respectively, of the second transistor, and a gate 5G. The sixth transistor 207 has a source 6S coupled to the BLX 111, a drain 6D coupled to the gate 5G, and a gate 6G coupled to the WL 107.

Regarding the inverter circuit 105, the source 7S of transistor 209 and the source 9S of transistor 213 are coupled to a power rail 217, whereas the source 8S of the transistor 211 and the source 10S of the transistor 215 are coupled to a ground rail 219. The drains 7D and 8D of transistors 209 and 211 and gates 9G and 10G of transistors 213 and 215 are coupled to the drain 1D; and the drains 9D and 10D of transistors 213 and 215, gate 7G of transistor 209, and the gate 8G of transistor 211 are coupled to the source 2S.

Each of the third transistor 201 and the fifth transistor 205 include a PMOS transistor. Further, each of the fourth transistor 203 and the sixth transistor 207 may include an NMOS transistor. The third transistor may be in an active state when the drain 1D, the BLX 111, and the WL 107 are at a high voltage state, and the BL 109 is at a low voltage state.

Advantages of the design of FIG. 2 include improved write current levels for a more reliable write operation at the SRAM memory cell and without a need for a higher supply voltage (e.g., no change required to previous design), which could provide for a better yield of memory cells when considering a minimum voltage (Vmin) parameter at an IC. Further, no write assist circuit is required.

FIG. 3 illustrates a table 300 of example combinations of access signals and related operations at an SRAM cell. In the table 300, during a "read" operation 301, when signals on the WL 107, BL 109, and BLX 111 are at a high voltage state, then the first transistor 101, the second transistor 103, the fourth transistor 203, and the sixth transistor 207 are in active states while the third transistor 201 and the fifth transistor 205 are in an inactive state, which would result in no increase in the "read" mode current. Further, during a "write" operation 303, when signals on the WL 107 and the BLX 111 are at a high voltage state, and the BL 109 is at a low voltage state, then the first transistor 101, the second transistor 103, the third transistor 201, the fourth transistor 203, and the sixth transistor 207 are in active states while the fifth transistor 205 is in an inactive state, which would result an increase in the "write" mode current. Furthermore, during a "disturb" operation 305 (e.g., half selected cell for a read operation after a write operation), when signals on the WL 107, BL 109, and BLX 111 are at a high voltage state, then the first transistor 101, the second transistor 103, the fourth transistor 203, and the sixth transistor 207 are in active states while the third transistor 201 and the fifth transistor 205 are in inactive states, which would result in no degradation of the disturb margin.

The embodiments of the present disclosure can achieve several technical effects, including improved current levels during a write operation at an SRAM memory cell in an IC device without sacrificing space for a write assist circuit. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A circuit comprising:
    a six transistor static random access memory (SRAM) cell comprising:
        a first inverter cross-coupled to a second inverter,
        a first transistor having a first source coupled to a first bit-line, a first drain coupled to the first inverter, and a first gate coupled to a word-line, and
        a second transistor having a second source coupled to the second inverter, a second drain coupled to a second bit-line, and a second gate coupled to the word-line; and
        a plurality of bit-line sensing transistors coupled to the first transistor and to the second transistor, wherein the plurality of bit-line sensing transistors comprises:
            a third transistor having a third source coupled to the first source, a third drain coupled to the first drain, and a third gate;
            a fourth transistor having a fourth drain coupled to the third gate, a fourth source coupled to the first bit-line, and a fourth gate coupled to the word-line;
            a fifth transistor having a fifth source coupled to the second source, a fifth drain coupled to the second drain, and a fifth gate; and
            a sixth transistor having a sixth source coupled to the second bit-line, a sixth drain coupled to the fifth gate, and a sixth gate coupled to the word-line.

2. The circuit of claim 1, wherein the first transistor and the second transistor comprise passgate NMOS transistors.

3. The circuit of claim 1, further comprises:
    the first inverter comprising a seventh transistor having a seventh source, a seventh drain, and a seventh gate, and an eighth transistor having an eighth source, an eighth drain, and an eighth gate; and
    the second inverter comprising a ninth transistor having a ninth source, a ninth drain, and a ninth gate, and a tenth transistor having a tenth source, a tenth drain, and a tenth gate,
        wherein the seventh source and the ninth source are coupled to a power rail,
        wherein the eighth source and the tenth source are coupled to a ground rail,
        wherein the seventh drain, the eighth drain, the ninth gate, and the tenth gate are coupled to the first drain, and
        wherein the ninth drain, the tenth drain, the seventh gate, and the eighth gate are coupled to the second source.

4. The circuit of claim 1, wherein each of the third transistor and the fifth transistor comprises a write PMOS transistor.

5. The circuit of claim 1, wherein each of the fourth transistor and the sixth transistor comprises a write NMOS transistor.

6. The circuit of claim 1, wherein the third transistor is in an active state when the first drain, the second bit-line, and the word-line are at a high voltage state, and the first bit-line is at a low voltage state.

7. A circuit comprising:
    a six transistor static random access memory (SRAM) cell comprising:
        a first inverter cross-coupled to a second inverter,
        a first transistor having a first source coupled to a first bit-line, a first drain coupled to the first inverter, and a first gate coupled to a word-line, and
        a second transistor having a second source coupled to the second inverter, a second drain coupled to a second bit-line, and a second gate coupled to the word-line; and
        a plurality of bit-line sensing transistors coupled to the first transistor and to the second transistor, wherein the plurality of bit-line sensing transistors comprises:
            a third transistor having a third source coupled to the first source, a third drain coupled to the first drain, and a third gate;
            a fourth transistor having a fourth drain coupled to the third gate, a fourth source coupled to the first bit-line, and a fourth gate coupled to the word-line;
            a fifth transistor having a fifth source coupled to the second source, a fifth drain coupled to the second drain, and a fifth gate; and a sixth transistor having a sixth source coupled to the second bit-line, a sixth drain coupled to the fifth gate, and a sixth gate coupled to the word-line, wherein each of the third transistor and the fifth transistor comprises a write PMOS transistor, wherein each of the fourth transistor and the sixth transistor comprises a write NMOS transistor, wherein the third transistor is in an active state when the first drain, the second bit-line, and the word-line are at a high voltage state, and the first bit-line is at a low voltage state, and wherein the first transistor and the second transistor comprise passgate NMOS transistors.

8. The circuit of claim 7, further comprises:

the first inverter comprising a seventh transistor having a seventh source, a seventh drain, and a seventh gate, and an eighth transistor having an eighth source, an eighth drain, and an eighth gate; and the second inverter comprising a ninth transistor having a ninth source, a ninth drain, and a ninth gate, and a tenth transistor having a tenth source, a tenth drain, and a tenth gate, wherein the seventh source and the ninth source are coupled to a power rail, wherein the eighth source and the tenth source are coupled to a ground rail, wherein the seventh drain, the eighth drain, the ninth gate, and the tenth gate are coupled to the first drain, and wherein the ninth drain, the tenth drain, the seventh gate, and the eighth gate are coupled to the second source.

9. The circuit of claim 7, wherein the third transistor in the active state sources a higher current level during a write operation when compared to one or more other current levels sourced during one or more other operations at the SRAM cell.

10. A method comprising:

providing a six transistor static random access memory (SRAM) cell comprising:

providing a first inverter cross-coupled to a second inverter, providing a first transistor having a first source coupled to a first bit-line, a first drain coupled to the first inverter, and a first gate coupled to a word-line, and providing a second transistor having a second source coupled to the second inverter, a second drain coupled to a second bit-line, and a second gate coupled to the word-line; and providing a plurality of bit-line sensing transistors coupled to the first transistor and to the second transistor, wherein providing the plurality of bit-line sensing transistors further comprises:

providing a third transistor having a third source coupled to the first source, a third drain coupled to the first drain, and a third gate;

providing a fourth transistor having a fourth drain coupled to the third gate, a fourth source coupled to the first bit-line, and a fourth gate coupled to the word-line;

providing a fifth transistor having a fifth source coupled to the second source, a fifth drain coupled to the second drain, and a fifth gate; and providing a sixth transistor having a sixth source coupled to the second bit-line, a sixth drain coupled to the fifth gate, and a sixth gate coupled to the word-line.

11. The method of claim 10, wherein the first transistor and the second transistor comprise passgate NMOS transistors.

12. The method of claim 10, further comprises:

providing for the first inverter a seventh transistor having a seventh source, a seventh drain, and a seventh gate, and an eighth transistor having an eighth source, an eighth drain, and an eighth gate;

providing for the second inverter a ninth transistor having a ninth source, a ninth drain, and a ninth gate, and a tenth transistor having a tenth source, a tenth drain, and a tenth gate;

coupling the seventh source and the ninth source to a power rail;

coupling the eighth source and the tenth source to a ground rail;

coupling the seventh drain, the eighth drain, the ninth gate, and the tenth gate to the first drain; and coupling the ninth drain, the tenth drain, the seventh gate, and the eighth gate to the second source.

13. The method of claim 10, wherein each of the third transistor and the fifth transistor comprises a write PMOS transistor.

14. The method of claim 10, wherein each of the fourth transistor and the sixth transistor comprises a write NMOS transistor.

15. The method of claim 10, wherein the third transistor is in an active state when the first drain, the second bit-line, and the word-line are at a high voltage state, and the first bit-line is at a low voltage state.

* * * * *